(12) United States Patent
Sutou et al.

(10) Patent No.: US 8,193,084 B2
(45) Date of Patent: Jun. 5, 2012

(54) METHOD OF MANUFACTURING SEMICONDUCTOR DEVICE

(75) Inventors: Kazuyuki Sutou, Ashikaga (JP); Hiroaki Tomita, Ota (JP)

(73) Assignees: Semiconductor Components Industries, LLC, Phoenix, AZ (US); SANYO Semiconductor Co., Ltd., Gunma (JP); SANYO Semiconductor Manufacturing Co., Ltd., Ojiya-shi (JP)

( * ) Notice: Subject to any disclaimer, the term of this patent is extended or adjusted under 35 U.S.C. 154(b) by 0 days.

(21) Appl. No.: 12/591,491

(22) Filed: Nov. 20, 2009

(65) Prior Publication Data
US 2010/0130000 A1     May 27, 2010

(30) Foreign Application Priority Data
Nov. 21, 2008 (JP) ................... 2008-297573

(51) Int. Cl.
*H01L 21/60* (2006.01)
(52) U.S. Cl. ............... 438/612; 257/E21.509; 438/618
(58) Field of Classification Search .............. 438/612, 438/637, 675, 667, 678, 618
See application file for complete search history.

(56) References Cited

U.S. PATENT DOCUMENTS

| | | | | |
|---|---|---|---|---|
| 2002/0117761 | A1* | 8/2002 | Zohni | 257/774 |
| 2002/0127772 | A1* | 9/2002 | Lin | 438/108 |
| 2006/0246706 | A1* | 11/2006 | Ke et al. | 438/613 |
| 2007/0145590 | A1 | 6/2007 | Noma et al. | |

FOREIGN PATENT DOCUMENTS

JP    2007-165696    6/2007

* cited by examiner

*Primary Examiner* — Savitri Mulpuri
(74) *Attorney, Agent, or Firm* — Morrison & Foerster LLP

(57) ABSTRACT

When a bump electrode is formed on an opening formed in a semiconductor substrate, the invention prevents a void that is caused by gas trapped in the opening. A method of manufacturing a semiconductor device of the invention includes forming a first wiring on a main surface of a semiconductor substrate, forming an opening in the semiconductor substrate from the back surface to the main surface so as to expose the back surface of the first wiring, forming a second wiring connected to the back surface of the first wiring and extending from inside the opening onto the back surface of the semiconductor substrate, forming a solder layer connected to part of the second wiring on the bottom of the opening and extending from inside the opening onto the back surface of the semiconductor substrate, and forming a bump electrode on the opening by reflowing the solder layer.

5 Claims, 5 Drawing Sheets

METHOD OF MANUFACTURING SEMICONDUCTOR DEVICE

CROSS-REFERENCE OF THE INVENTION

This application claims priority from Japanese Patent Application No. 2008-297573, the content of which is incorporated herein by reference in its entirety.

BACKGROUND OF THE INVENTION

1. Field of the Invention

The invention relates to a method of manufacturing a semiconductor device, in particular, to a method of manufacturing a semiconductor device characterized by a method of forming a bump electrode on an opening of a semiconductor substrate.

2. Description of the Related Art

In order to utilize a main surface of a semiconductor substrate effectively, a technique of forming a bonding electrode for electric connection with an external board or the like on a back surface of a semiconductor die has been introduced. For this technique, a technique of forming a bump electrode 28 made of solder or the like on an electrode formed on a back surface has been prevailingly used as a CSP technique has been developed. Hereafter, a method of forming this bump electrode 28 will be described referring to FIGS. 5A and 5B. First, as shown in FIG. 5A, a first wiring 23 is formed on a main surface of a semiconductor substrate 21 with a first insulation film 22 made of an oxide film or the like being interposed therebetween. An opening 24 is then formed in the semiconductor substrate 21 from the back surface of the semiconductor substrate 21 so as to expose the back surface of the first wiring 23.

Then a second insulation film 25 made of an oxide film or the like is formed in the opening 24 and on the back surface of the semiconductor substrate 21, the back surface of the first wiring 23 is then exposed, and a second wiring 26 is formed from inside the opening 24 onto the back surface so as to be connected to the back surface of the wiring 23. Finally, a solder paste or the like is printed in a region on the back surface including the opening 24 by a screen printing method or the like to form a solder layer 27, and the solder layer 27 is reflowed to form the bump electrode 28 connected to the first wiring 23 as shown in FIG. 5B. A protection film 30 is formed on the first wiring 23.

This kind of technique such that the bump electrode 28 made of solder or the like is formed on the back surface of the semiconductor substrate 21 is described in Japanese Patent Application Publication No. 2007-165696.

Conventionally, as described above, the solder layer 27 made of a solder paste or the like is formed thick on the back surface of the semiconductor substrate 21 so as to cover the opening 24 in which the second wiring 26 connected to the first wiring 23 is formed. Since gas 31 trapped and remaining between the solder paste or the like and the opening 24 may form a void 29 after the reflowing process, various attempts have been made to prevent the void 29, such as performing a defoaming treatment while forming the solder layer 27. As other attempt, the bump electrode 28 is formed away from the opening 24 in order to prevent this problem and the increase of the processes. If these attempts are not made and the void 29 is formed, the void 29 repeats expansion and contraction by a subsequent heat treatment cycle for mounting the semiconductor substrate 21 on a mounting board and by the heat of the semiconductor device 21 or the like during the use after the mounting, thereby causing a problem such as cracking at this portion. Furthermore, impurities from the solder paste or the like that remain in the void 29 may corrode the bump electrode 28 or the like. Accordingly, it is necessary to solve these problems by preventing the void 29 from being formed in the bump electrode 28 without an additional process such as a defoaming treatment or the like.

SUMMARY OF THE INVENTION

The invention provides a method of manufacturing a semiconductor device. The method includes providing a semiconductor substrate having a first insulation film formed on the main surface of the semiconductor substrate, forming a first wiring on the first insulation film, and forming an opening in the semiconductor substrate from the back surface of the semiconductor substrate so as to expose the first insulation film. The opening has a first end at the main surface and a second end at the back surface. The method also includes forming a second insulation film in the opening and on the back surface, forming a second wiring on the second insulation film so that the second wiring is connected to the first wiring at the first end and extends from inside the opening and beyond the second end to cover a portion of the back surface, forming a solder layer on the back surface so as to be in contact with the second wiring extending beyond the second end and so as not to cover a portion of the second end of the opening, and reflowing the solder layer so that a portion of the solder layer flows into the opening.

DETAILED DESCRIPTION OF THE INVENTION

Figure 1A:
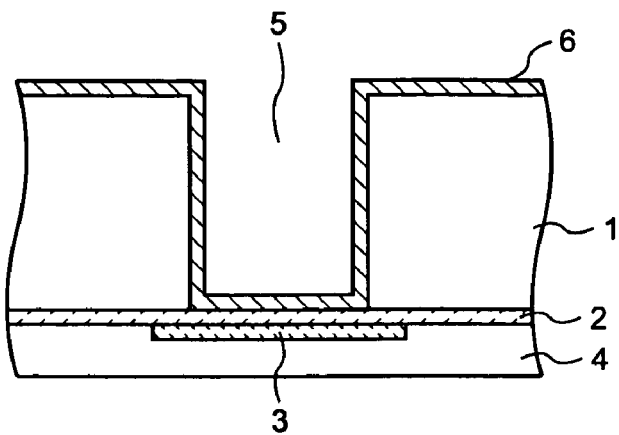
FIGS. 1A, 1B and 1C are cross-sectional views showing a method of manufacturing a semiconductor device of an embodiment of the invention.

A method of manufacturing a semiconductor device of the invention will be described referring to figures. Since the invention mainly relates to a bump electrode 9 formed on a back surface of a semiconductor substrate 1, the description will be given with figures showing the bump electrode 9 of the invention and its surroundings only, without showing the whole semiconductor substrate 1. First, as shown in FIG. 1A, a first wiring 3 is formed on the main surface of the semiconductor substrate 1, in which various semiconductor elements are formed by a diffusion treatment or the like, with a first insulation film 2 made of an oxide film or the like being interposed therebetween. The first wiring 3 is made of a metal layer mainly containing, for example, Al, Cu or the like, and electrically connected to the semiconductor element formed in the semiconductor substrate 1, and a protection insulation film 4 is formed on the front surface thereof. In this case, as shown in FIG. 1B, a supporting body 11 made of glass, silicon, plastic or the like may be formed on the insulation film 4 with an adhesive layer 10 being interposed therebetween.

Figure 1B:
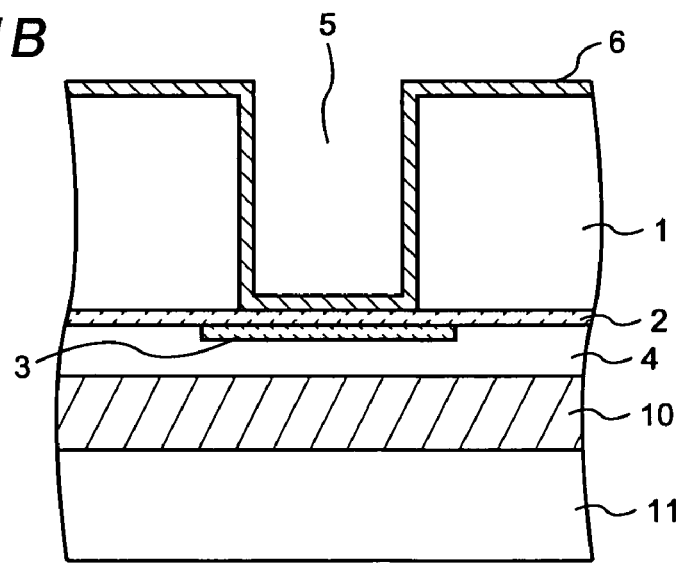
Figure 1C:
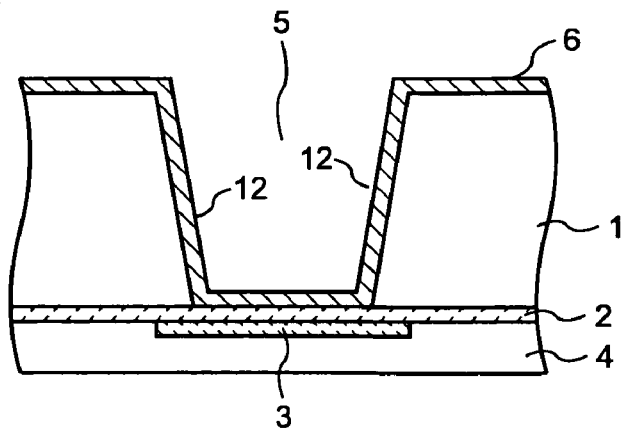

As shown in FIGS. 1A and 1B, an opening 5 is then formed in the semiconductor substrate 1 from the back surface to the main surface by a predetermined photo-etching process. The opening 5 is preferably formed so as to have a slope portion 12 that gradually narrows the opening from the back surface toward the main surface as shown in FIG. 1C. On the main surface side of the semiconductor substrate 1, the opening 5 faces the back surface of the first wiring 3 with the first insulation film 2 formed on the back surface of the first wiring 3 being interposed therebetween. A second insulation film 6 is then formed so as to extend from the bottom and sidewall portions of the opening 5 onto the back surface of the semiconductor substrate 1.

Figure 2:
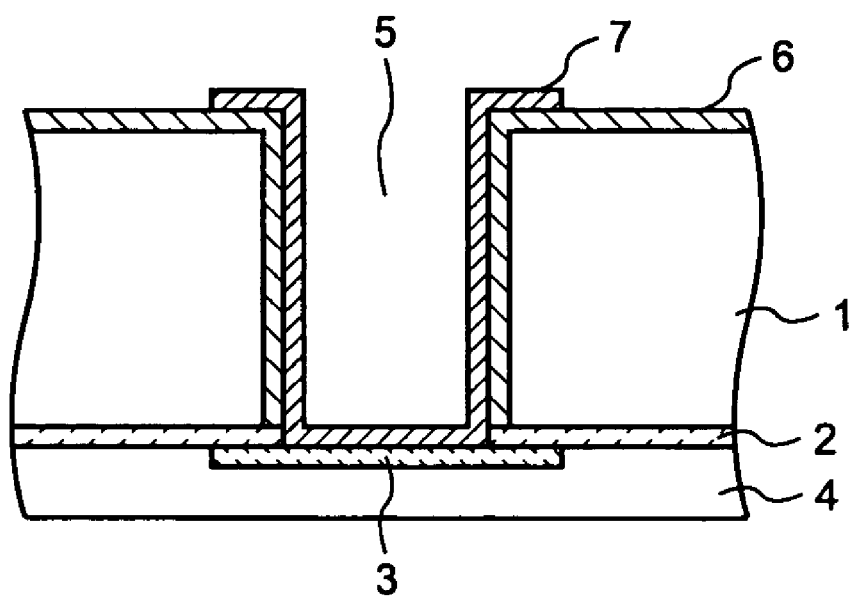
FIG. 2 is a cross-sectional view showing the method of manufacturing the semiconductor device of the embodiment of the invention.

As shown in FIG. 2, the first insulation film 2 and the second insulation film 6 on the bottom of the opening 5 and on the back surface of the first wiring 3 are then etched and removed, and a second wiring 7 is formed so as to be connected to the first wiring 3 and extend from inside the opening 5 onto the back surface of the semiconductor substrate 1 by a predetermined process. The second wiring 7 is made of a metal layer mainly containing, for example, Al or the like, and a plating layer (not shown) made of, for example, Ni, Au or the like is formed on the second wiring 7. The second wiring 7 may be made of a metal layer mainly containing Cu.

Alternatively, the first insulation film 2 on the bottom of the opening 5 is etched and removed, and then the second insulation film 6 is formed so as to extend from the bottom and sidewall portions of the opening 5 onto the back surface of the semiconductor substrate 1. The second insulation film 6 on the bottom of the opening 5 is then etched and removed so as to expose the first wiring 3.

Figure 3A:
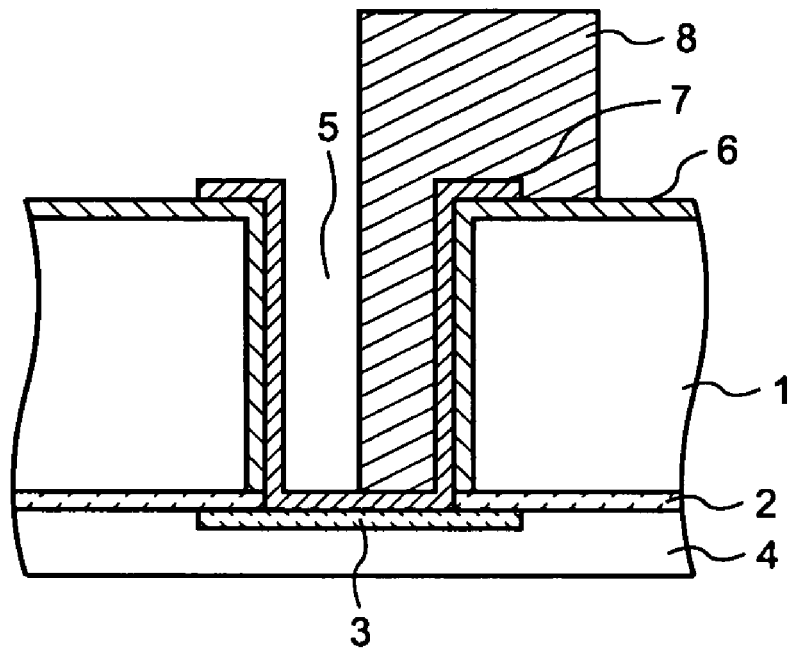
FIGS. 3A and 3B are cross-sectional views showing the method of manufacturing the semiconductor device of the embodiment of the invention.

As shown in FIG. 3A, a solder paste or the like is then printed by a screen printing method, a dispensing method or the like to form a solder layer 8 extending from part of the opening 5 onto the back surface of the semiconductor substrate 1. The solder layer 8 is connected to part of the second wiring 7 on the bottom of the opening 5, the second wiring 7 on the sidewall of the opening that extends from the part of the second wiring mentioned above, and the second wiring 7 on the back surface of the semiconductor substrate 1.

Figure 3B:
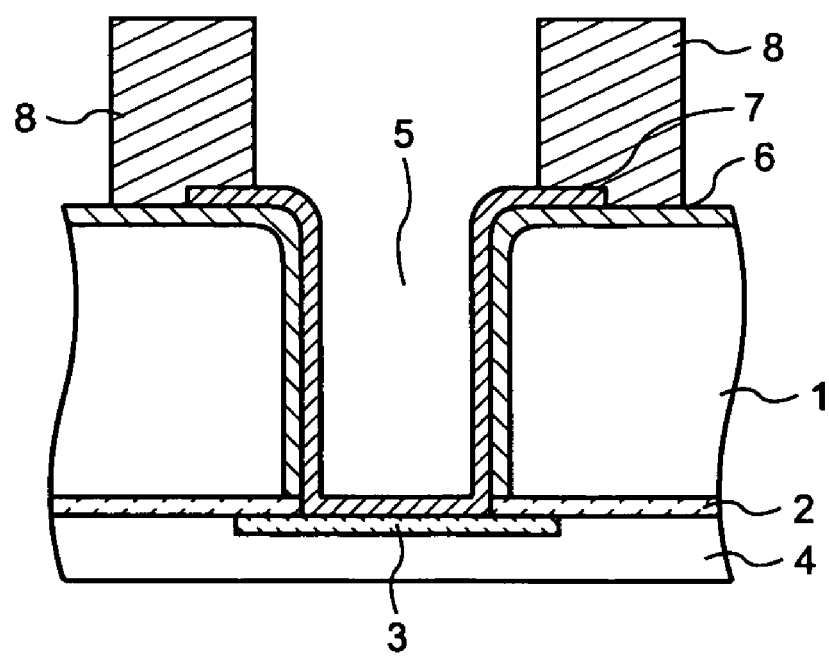

The solder layer 8 may extend onto the back surface region where the second wiring 7 is not formed as shown in FIG. 3A. Even when the width of the solder layer 8 on the back surface is increased in order to secure the height of the bump electrode after it is reflowed, the reduction of the width of the bump electrode 9 on the back surface of the semiconductor substrate 1 is achieved. This is because the solder flows onto the second wiring 7 having high wettability for solder in the subsequent reflowing process and removed away from on the oxide film. Alternatively, as shown in FIG. 3B, the solder layer 8 may be formed only on the second wiring 7 formed on the back surface of the semiconductor substrate 1 and on the outside thereof except inside the opening 5. In this case, it is preferable to form the opening 5 so as to be sloped, i.e., the lateral edge of the opening 5 is curved or truncated, so that the opening narrows from the upper side toward the inner side since this allows the solder to smoothly flow into the opening 5 when the solder is reflowed. For the same reason, it is preferable to form the opening 5 so as to have a corner-less cylindrical shape.

Figure 4:
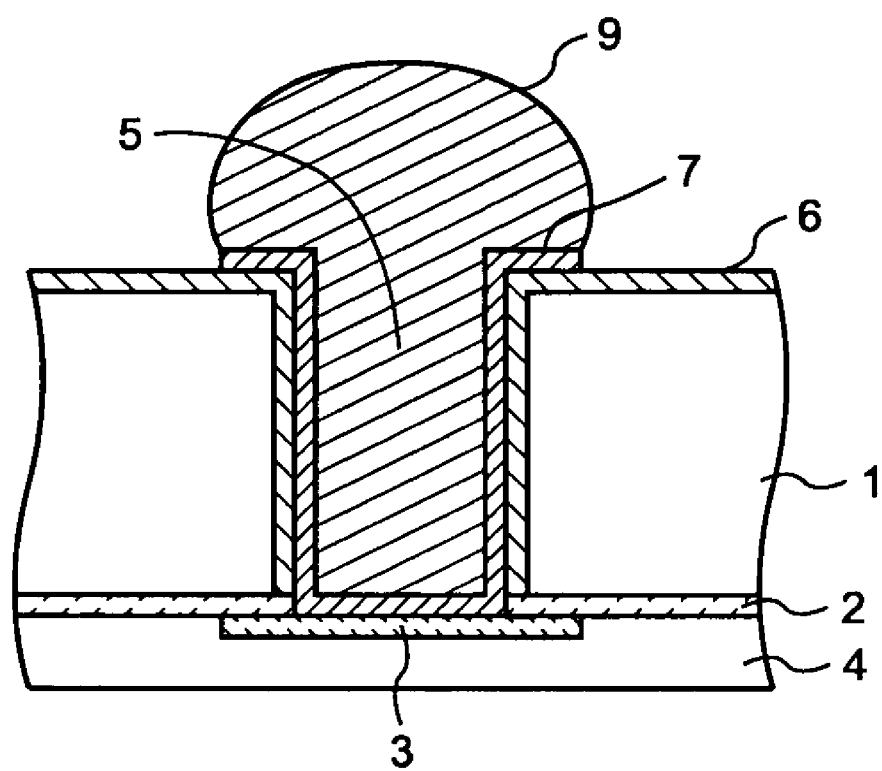
FIG. 4 is a cross-sectional view showing the method of manufacturing the semiconductor device of the embodiment of the invention.
Figure 5A:
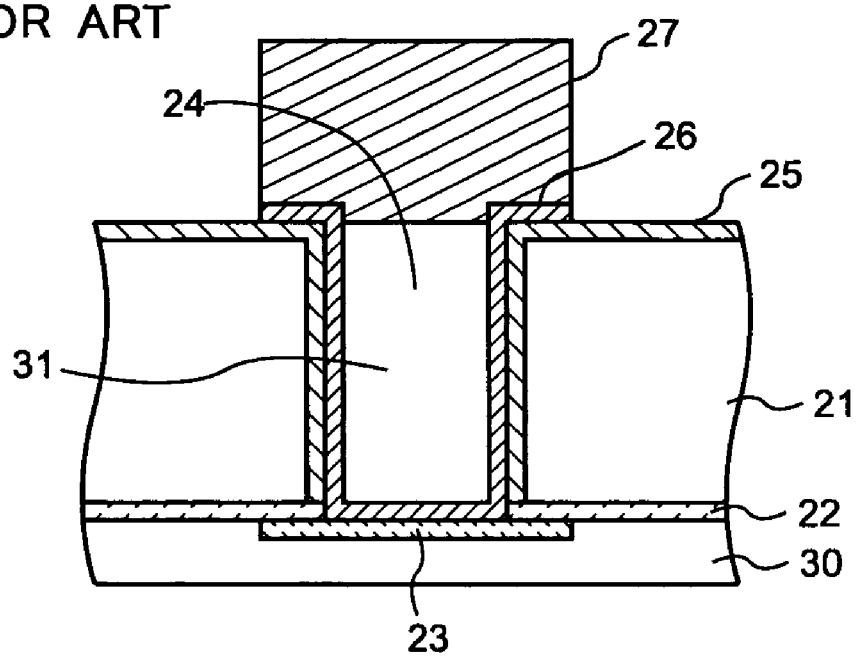
FIGS. 5A and 5B are cross-sectional views showing a conventional method of manufacturing a semiconductor device.
Figure 5B:
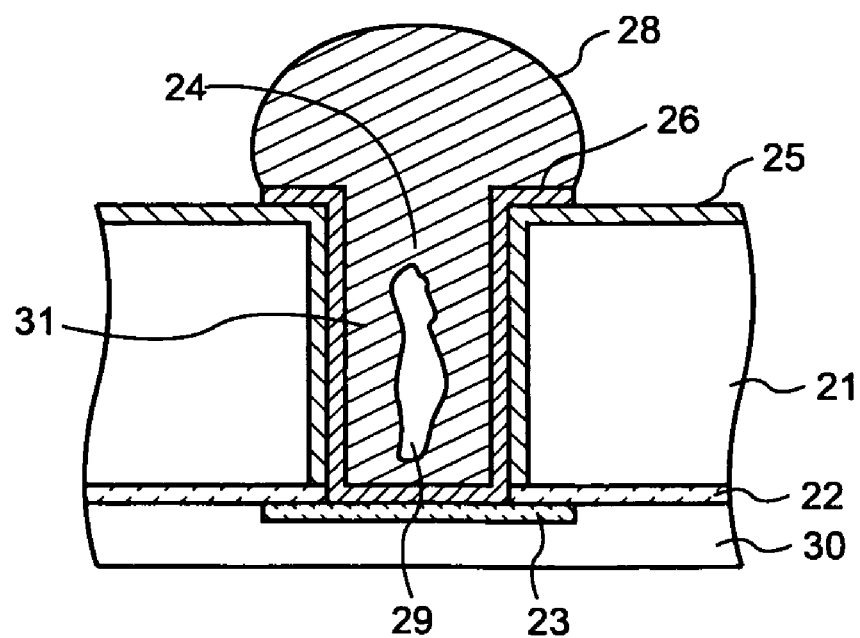

Finally, as shown in FIG. 4, a heat treatment is performed to this at a predetermined temperature in order to reflow the solder to form the bump electrode 9. As described above, the solder layer 8 shown in FIG. 3A melts and wets the second wiring 7 to fill the opening 5 as the surface is rounded by the surface tension. The solder flowing out of the opening 5 flows onto the second wiring 7 on the back surface where the solder layer 8 is not formed at first. In the end, the solder forms the bump electrode 9 of which the end portion rests on the end portion of the second wiring 7 on the back surface. Since the melted solder wets the second wiring 7 and fills the opening 5 in this reflowing process, gas is not trapped in the melted solder to prevent a void 29 from being formed in the bump electrode 9.

In this case, the solder layer 8 does not necessarily cover part of the opening 5 as shown in FIG. 3A. As shown in FIG. 3B, the solder layer 8 may extend from the second wiring 7 on the back surface of the semiconductor substrate 1 on the outside of the opening 5 onto the outside thereof. Although the solder layer 8 is formed on either side of the opening 5 in FIG. 3B, it may be formed on one side of the opening 5. This is because the solder that is the melted solder layer 8 flows into the opening 5 to wet the second wiring 7 and then fills the opening 5 without forming a void in the opening 5. In the case of FIG. 3B, by forming the opening 5 round and providing the opening 5 with a sloped exit portion as shown in FIG. 3B, the melted solder smoothly flows into the opening 5 to fill the opening 5 even when the opening 5 has a small opening diameter. Therefore, this is effective to form the void-free bump electrode 9.

Although the bump electrode 9 is formed on the back surface of the semiconductor substrate 1 in the embodiment, the invention is not limited to this and also applicable to a case where the bump electrode 9 is formed on the main surface of the semiconductor substrate 1 as long as the technical concept is unchanged. In detail, the invention is applicable to the following case, for example. An opening is formed in an insulation film covering a first wiring on the semiconductor substrate 1 to expose the first wiring. Then a second wiring connected to the first wiring is formed on the insulation film including in the opening, and a solder layer is formed on the second wiring. Accordingly, it is possible to prevent a void formation in a solder bump electrode in an opening that is formed in a semiconductor substrate from a back surface to a main surface thereof.

What is claimed is:

1. A method of manufacturing a semiconductor device, comprising:
    providing a semiconductor substrate comprising a first insulation film formed on a main surface of the semiconductor substrate;
    forming a first wiring on the first insulation film;
    forming an opening in the semiconductor substrate from a back surface of the semiconductor substrate so as to expose the first insulation film, the opening having a first end at the main surface and a second end at the back surface;
    forming a second insulation film in the opening and on the back surface;
    forming a second wiring on the second insulation film so that the second wiring is connected to the first wiring at the first end and extends from inside the opening and beyond the second end to cover a portion of the back surface;
    forming a continuous solder layer on the back surface so as to be in contact with the second wiring extending beyond the second end and so as to enter the opening to cover only a portion of the second wiring on a sidewall and also a portion of the second wiring on a bottom of the opening; and
    reflowing the solder layer so that a portion of the solder layer flows into the opening, whereby the solder layer is formed on the back surface so that a portion of the solder layer is in contact with the second wiring at the first end of the opening prior to the reflowing.

2. The method of claim 1, wherein the solder layer is formed by a screen printing method.

3. The method of claim 1, wherein the solder layer is formed by a dispensing method.

4. The method of claim 1, wherein the second end of the opening is truncated.

5. The method of claim 1, wherein the opening is formed so as to have a cylindrical shape.

* * * * *